(12) United States Patent
Lee

(10) Patent No.: US 8,963,904 B2
(45) Date of Patent: Feb. 24, 2015

(54) CLOCK FEEDTHROUGH AND CROSSTALK REDUCTION METHOD

(75) Inventor: Yongman Lee, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 1033 days.

(21) Appl. No.: 12/839,076

(22) Filed: Jul. 19, 2010

(65) Prior Publication Data

US 2011/0227890 A1  Sep. 22, 2011

Related U.S. Application Data

(60) Provisional application No. 61/316,183, filed on Mar. 22, 2010.

(51) Int. Cl.
| | | |
|---|---|---|
| *G09G 5/00* | (2006.01) | |
| *H03K 5/12* | (2006.01) | |
| *H03K 3/00* | (2006.01) | |
| *H03K 3/012* | (2006.01) | |
| *H03K 17/04* | (2006.01) | |
| *H03K 17/16* | (2006.01) | |
| *H03K 17/687* | (2006.01) | |
| *H03K 4/02* | (2006.01) | |

(52) U.S. Cl.
CPC ............... *H03K 4/02* (2013.01); *H03K 17/163* (2013.01)
USPC ........................................................ 345/211

(58) Field of Classification Search
CPC ........................................................ G09G 5/00
See application file for complete search history.

(56) References Cited

U.S. PATENT DOCUMENTS

| | | |
|---|---|---|
| 6,229,531 B1 | 5/2001 | Nakajima et al. |
| 6,525,574 B1 | 2/2003 | Herrera |
| 6,867,760 B2 | 3/2005 | Yanagi et al. |
| 7,397,020 B2 | 7/2008 | Roh |

(Continued)

FOREIGN PATENT DOCUMENTS

| | | |
|---|---|---|
| EP | 0031583 A2 | 7/1981 |
| EP | 0734026 A2 | 9/1996 |

(Continued)

OTHER PUBLICATIONS

International Search Report and Written Opinion for PCT Application No. PCT/US2011/026502 mailed on Jun. 24, 2011, 11 pgs.

(Continued)

*Primary Examiner* — Adam R Giesy
*Assistant Examiner* — K. Kiyabu
(74) *Attorney, Agent, or Firm* — Fletcher Yoder PC

(57) ABSTRACT

Systems and methods of the present disclosure relates generally to techniques for controlling a gate signal applied to a transistor in an electronic component. One embodiment includes decreasing a skew rate at the rising and/or falling edges of the gate signal to reduce the effects of data signal errors. Decreasing the gate signal falling edge skew rate may decrease clock feedthrough effects of the transistor, and decreasing the gate signal rising edge skew rate may decrease crosstalk effects between more than one data paths in the electronic component. The falling edge skew rate may be manipulated by initially increasing the activating voltage of the gate signal to a higher voltage, such that the gate signal may take longer to fall. The rising edge skew rate may be manipulated by increasing a voltage later during the activating period, such that the gate signal may take longer to rise.

12 Claims, 8 Drawing Sheets

(56) References Cited

U.S. PATENT DOCUMENTS

| | | |
|---|---|---|
| 7,460,114 B2 | 12/2008 | Mizumaki |
| 7,586,477 B2 | 9/2009 | Lee |
| 2003/0189448 A1 | 10/2003 | Boemler |
| 2006/0001640 A1* | 1/2006 | Lee .............................. 345/100 |
| 2006/0238477 A1 | 10/2006 | Lew et al. |
| 2007/0008420 A1 | 1/2007 | Roh |
| 2007/0132488 A1* | 6/2007 | Hidaka et al. ................ 327/112 |
| 2007/0171168 A1* | 7/2007 | Park et al. ...................... 345/92 |
| 2008/0129718 A1 | 6/2008 | Nishimura et al. |
| 2010/0052755 A1 | 3/2010 | Rai et al. |
| 2010/0097367 A1* | 4/2010 | Kitayama et al. ............. 345/213 |

FOREIGN PATENT DOCUMENTS

| | | |
|---|---|---|
| JP | 56093184 A | 7/1981 |
| JP | 1997258174 A | 10/1997 |

OTHER PUBLICATIONS

Office Action for Taiwan Application No. 100108600 dated Aug. 28, 2013; 15 pgs.

* cited by examiner

CLOCK FEEDTHROUGH AND CROSSTALK REDUCTION METHOD

CROSS-REFERENCE TO RELATED APPLICATIONS

This application claims the benefit of U.S. Provisional Patent Application No. 61/316,183, entitled "Clock Feedthrough and Crosstalk Reduction Method," filed Mar. 22, 2010, which is herein incorporated by reference.

BACKGROUND

The present disclosure relates generally to electronic devices, and more particularly, to techniques for reducing clock feedthrough and crosstalk for such devices.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Liquid crystal displays (LCDs) are commonly used as screens or displays for a wide variety of electronic devices, including such consumer electronics as televisions, computers, and handheld devices (e.g., cellular telephones, audio and video players, gaming systems, and so forth). Such LCD devices typically provide a flat display in a relatively thin and low weight package that is suitable for use in a variety of electronic goods. In addition, such LCD devices typically use less power than comparable display technologies, making them suitable for use in battery powered powered devices or in other contexts where it is desirable to minimize power usage. LCD devices typically include a plurality of unit pixels arranged in a matrix.

LCD devices typically include thousands (or millions) of picture elements, i.e., pixels, arranged in a matrix of rows (also referred to as "scanning lines") and columns (also referred to as "data lines"). For any given pixel of an LCD device, the amount of light viewable on the LCD depends on the voltage driven to the pixel. Typically, LCDs include data line circuitry for converting digital image data into an analog voltage value which may be supplied to transistors in the pixels of the LCD. The transistor gates may be activated by scanning line circuitry to store the data signal in an electrode of the pixel. An electrical field is generated by a voltage difference between a pixel electrode and a common electrode, which may align liquid crystals molecules within an adjacent liquid crystal layer to modulate light transmission through the LCD panel.

The data signal driven to the pixel may be affected by certain characteristics of the pixel transistor and/or by the configuration of data lines in the LCD panel. For example, parasitic capacitances associated with the transistors may result in a voltage drop, referred to as "clock feedthrough," in the data signal stored in the pixel electrode, which may manifest in display errors such as artifacts and/or flickering on the displayed image. Furthermore, as current LCD devices may have a dense pixel matrix, the switching of adjacent transistors in the pixel matrix may result in crosstalk, which may also contribute to display errors.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure relates generally to techniques for controlling a gate signal applied to a transistor in an electronic component. One embodiment includes decreasing a skew rate at the rising edge and/or the falling edge of the gate signal applied to the transistor gates to reduce the effects of data signal errors. Decreasing the skew rate of the gate signal falling edge may decrease clock feedthrough effects of the transistor. More specifically, a voltage drop of a data signal transmitted through the transistor may be reduced, possibly improving the integrity of the data signal. Further, decreasing the skew rate of the gate signal rising edge may decrease crosstalk effects between more than one transistor and/or more than one data line in the electronic component. The falling edge skew rate of the gate signal may be manipulated by initially driving the activating voltage of the gate signal to a higher voltage (referred to as pre-emphasizing), such that the gate signal may take a longer time to fall to the deactivating voltage level. Furthermore, the rising edge skew rate may be manipulated by driving the activating voltage higher at a later portion of the activating period, such that the gate signal may take a longer time to rise to the activating voltage level.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments described below, the articles "a," "an," and "the" are intended to mean that there are one or more of the elements. The terms "comprising," "including," and "having" are intended to be open-ended and inclusive and mean that there may be additional elements other than the listed elements. Additionally, it should be understood that references to "one embodiment," "an embodiment," "some embodiments," and the like are not intended to be interpreted as excluding the existence of additional embodiments that also incorporate the disclosed features.

As will be discussed below, the present disclosure is generally directed to electronic devices and components which implement switching transistors. More specifically, the present techniques involve methods of controlling a voltage applied at the gates of such transistors such that undesirable effects such as clock feedthrough and/or crosstalk may be reduced. While the examples given throughout the disclosure the disclosure may apply generally to electronic display devices in particular, the present disclosure is not limited to display devices. Techniques for reducing clock feedthrough and crosstalk by controlling a transistor gate voltage may apply to various electronic components and systems that involve the activation and deactivation of transistors.

Figure 1:
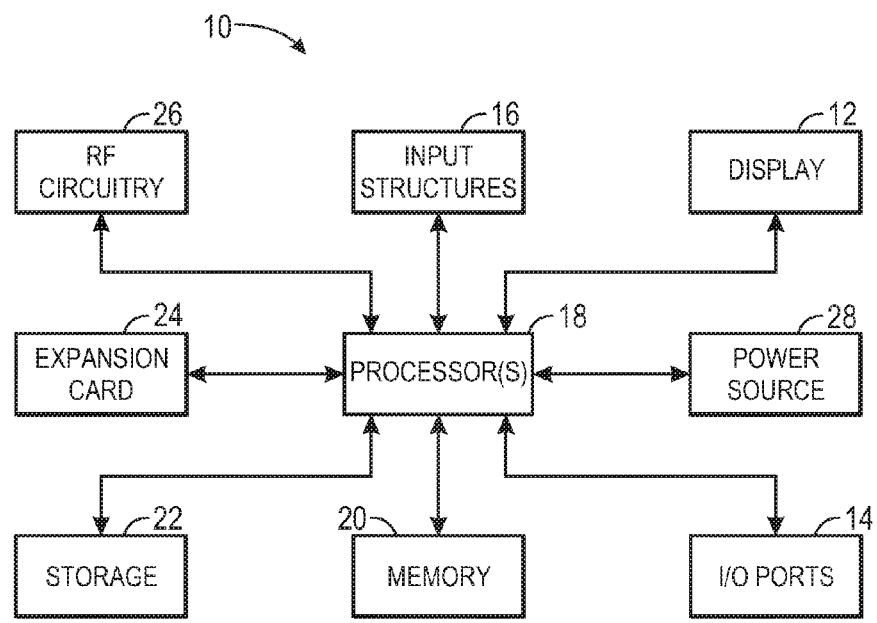
FIG. 1 is a block diagram depicting exemplary components of an electronic device, in accordance with aspects of the present disclosure.
Figure 2:
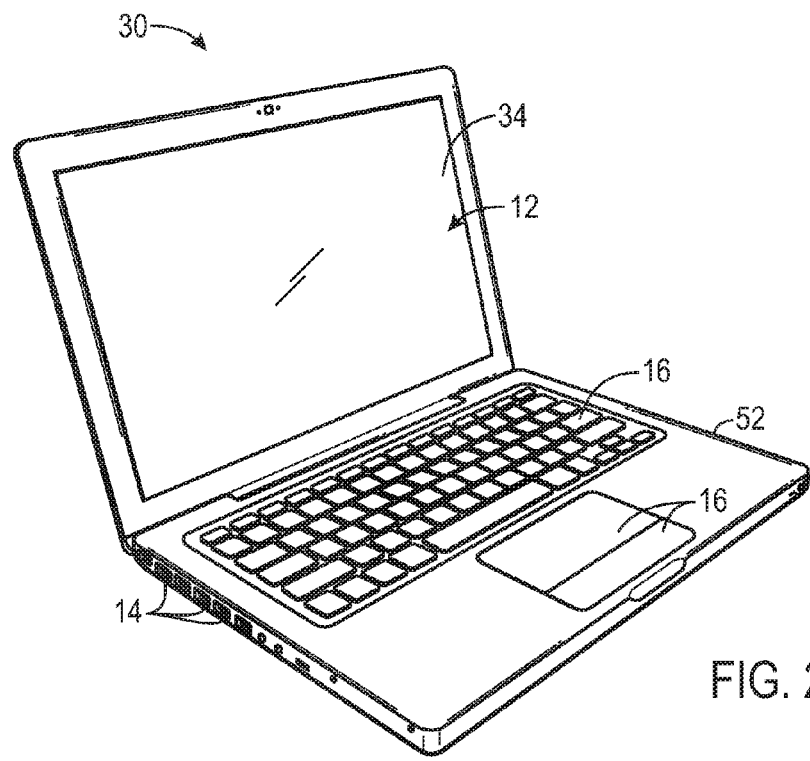
FIG. 2 is a view of a computer, in accordance with aspects of the present disclosure.
Figure 3:
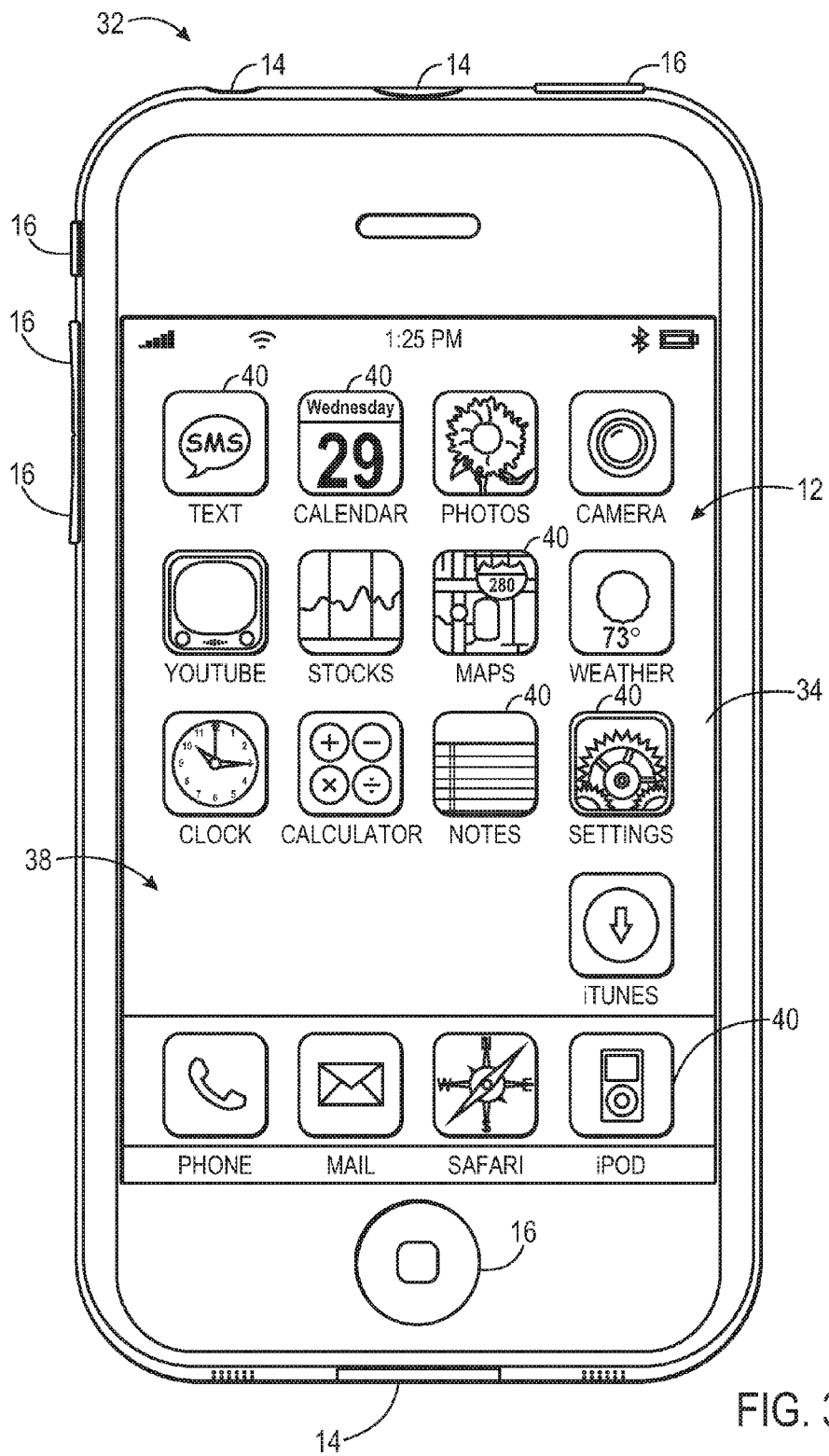
FIG. 3 is a front view of a handheld electronic device, in accordance with aspects of the present disclosure.

With these foregoing features in mind, examples for suitable electronic systems that may implement transistor gate signal modifications in accordance with aspects of the present disclosure are provided below. In FIG. 1, a block diagram depicting various components that may be present in electronic devices suitable for use with the present techniques is provided. In FIG. 2, one example of a suitable electronic device, provided here as a handheld electronic device, is depicted. In FIG. 3, another example of a suitable electronic device, provided here as a computer system, is depicted. These types of electronic devices, and other electronic devices providing comparable display capabilities, may be used in conjunction with the present techniques.

An example of a suitable electronic device may include various internal and/or external components which contribute to the function of the device. FIG. 1 is a block diagram illustrating the components that may be present in such an electronic device 10 and which may allow the device 10 to function in accordance with the techniques discussed herein.

Those of ordinary skill in the art will appreciate that the various functional blocks shown in FIG. 1 may comprise hardware elements (including circuitry), software elements (including computer code stored on a computer-readable medium) or a combination of both hardware and software elements. It should further be noted that FIG. 1 is merely one example of a particular implementation and is implementation and is merely intended to illustrate the types of components that may be present in a device 10. For example, in the presently illustrated embodiment, these components may include a display 12, I/O ports 14, input structures 16, one or more processors 18, a memory device 20, a non-volatile storage 22, expansion card(s) 24, a networking device 26, and a power source 28.

The display 12 may be used to display various images generated by the electronic device 10. In one embodiment, the display 12 may be a liquid crystal display (LCD). For example, the display 12 may be an LCD employing fringe field switching (FFS), in-plane switching (IPS), or other techniques useful in operating such LCD devices. Additionally, in certain embodiments of the electronic device 10, the display 12 may be provided in conjunction with a touch-sensitive element, such as a touchscreen, that may be used as part of the control interface for the device 10. The display 12 may include a matrix of pixels and circuitry for modulating the transmittance of light through each pixel to display an image. A more detailed example of such display circuitry is provided in FIG. 4.

In certain embodiments, an input structure 16 and display 12 may be provided together, such an in the case of a touchscreen where a touch-sensitive mechanism is provided in conjunction with the display 12. In such embodiments, the user may select or interact with displayed interface elements via the touch-sensitive mechanism. In this way, the displayed interface may provide interactive functionality, allowing a user to navigate the displayed interface by touching the display 12. For example, user interaction with the input structures 16, such as to interact with a user or application interface displayed on the display 12, may generate electrical signals indicative of the user input. These input signals may be routed via suitable pathways, such as an input hub or data bus, to the one or more processor 18 for further processing.

FIG. 2 illustrates an embodiment of the electronic device 10 in the form of a computer 30. The computer 30 may include computers that are generally portable (such as laptop, notebook, tablet, and handheld computers), as well as computers that are generally used in one place (such as conventional desktop computers, workstations and/or servers). In certain embodiments, the electronic device 10 in the form of a computer may be a model of a MacBook®, MacBook® Pro, MacBook Air®, iMac®, Mac® Mini, or Mac Pro®, available from Apple Inc. of Cupertino, Calif. The depicted computer 30 includes a housing or enclosure 33, the display 12, I/O ports 14, and input structures 16.

The display 12 may be integrated with the computer 30 (e.g., such as the display of a laptop computer) or may be a standalone display that interfaces with the computer 30 using one of the I/O ports 14, such as via a DisplayPort, DVI, High-Definition Multimedia Interface (HDMI), or analog (D-sub) interface. For instance, in certain embodiments, such a standalone display 12 may be a model of an Apple Cinema Display®, available from Apple Inc.

The electronic device 10 may also take the form of other types of devices, such as mobile telephones, media players, personal data organizers, handheld game platforms, cameras, and/or combinations of such devices. For instance, as generally depicted in FIG. 3, the device 10 may be provided in the form of a handheld electronic device 32 that includes various functionalities (such as the ability to take pictures, make telephone calls, access the Internet, communicate via email, record audio and/or video, listen to music, play games, connect to wireless networks, and so forth). By way of example, the handheld device 32 may be a model of an iPod®, iPod® Touch, or iPhone® available from Apple Inc.

In the depicted embodiment, the handheld device 32 includes the display 12, which may be in the form of an LCD 34. The LCD 34 may display various images generated by the handheld device 32, such as a graphical user interface (GUI) 38 having one or more icons 40.

In another embodiment, the electronic device 10 may also be provided in the form of a portable multi-function tablet computing device (not illustrated). In certain embodiments, the tablet computing device may provide the functionality of two or more of a media player, a web browser, a cellular phone, a gaming platform, a personal data organizer, and so forth. By way of example only, the tablet computing device may be a model of an iPad® tablet computer, available from Apple Inc.

With the foregoing discussion in mind, it may be appreciated that an electronic device 10 in either the form of a handheld device 30 (FIG. 2) or a computer 50 (FIG. 3) may be provided with a display device 10 in the form of an LCD 34. As discussed above, an LCD 34 may be utilized for displayed respective operating system and/or application graphical user interfaces running on the electronic device 10 and/or for displaying various data files, including textual, image, video data, or any other type of visual output data that may be associated with the operation of the electronic device 10.

Figure 4:
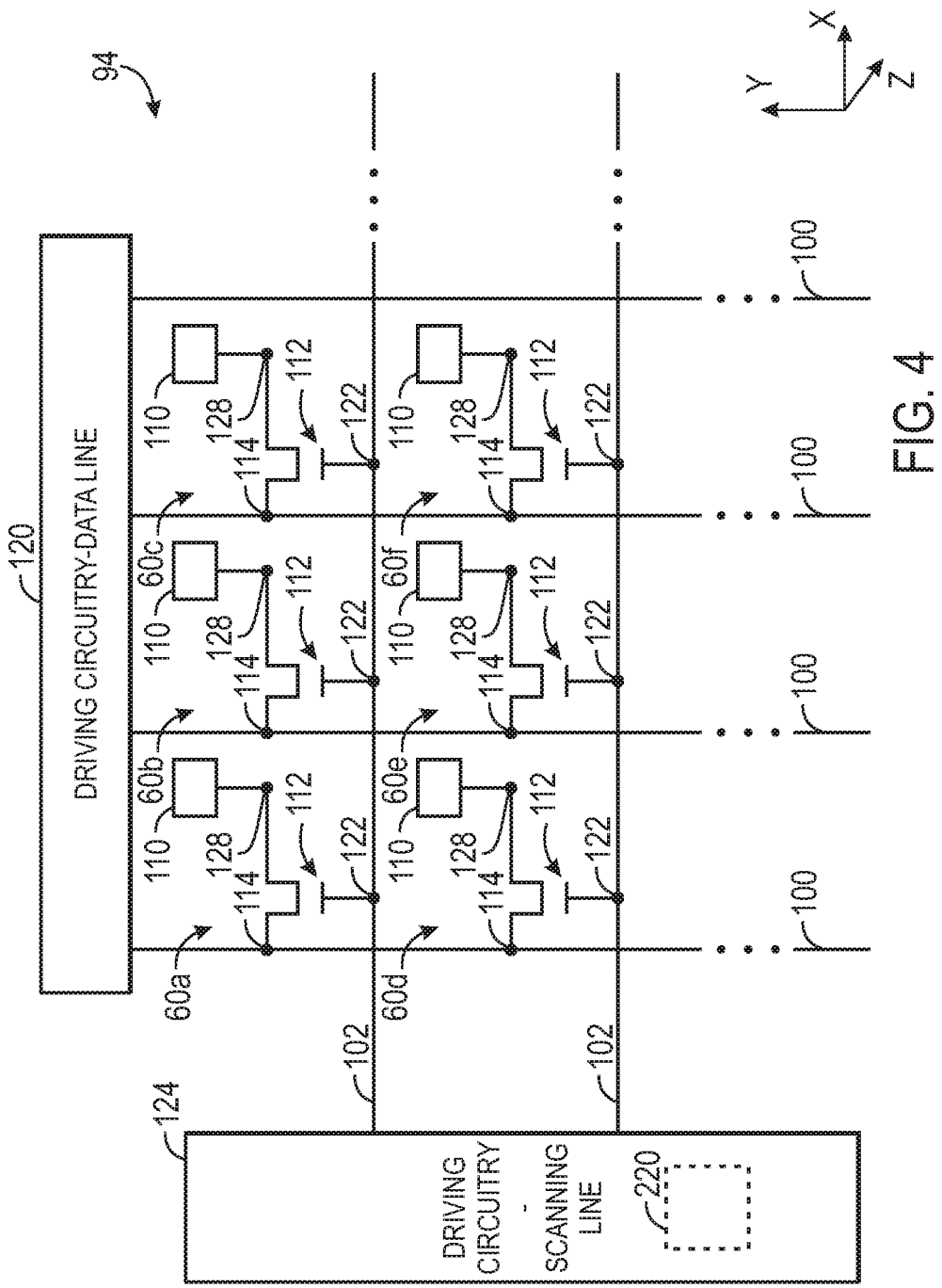
FIG. 4 is a circuit diagram showing switching and display circuitry that may be used in conjunction with an LCD display panel, in accordance with aspects of the present disclosure.

Continuing now to FIG. 4, a schematic circuit representation of pixel driving circuitry that may be found in an LCD 34 is shown. As depicted, a plurality of unit pixels 60, each of which may be formed in accordance with the unit pixel 60 shown in FIG. 4, may be disposed in a pixel array or matrix defining a plurality of rows and columns of unit pixels that collectively form an image display region of an LCD 34. In such an array, each unit pixel 60 may be defined by the intersection of rows and columns, which may be defined by the illustrated data (or "source") lines 100 and scanning (or "gate") lines 102, respectively.

Although only six unit pixels, referred to individually by the reference numbers 60a-60f, respectively, are shown in the present example for purposes of simplicity, it should be understood that in an actual LCD implementation, each data line 100 and scanning line 102 may include hundreds or even thousands of unit pixels. By way of example, in a color LCD panel 34 having a display resolution of 960×640, each data line 100, which may define a column of the pixel array, may include 640 unit pixels, while each scanning line 102, which may define a row of the pixel array, may include 960 groups of pixels, wherein each group has a red, blue, and green pixel, thus totaling 2880 unit pixels per scanning line 102. In the present illustration, the group of unit pixels 60a-60c may represent a group of pixels having a red pixel (60a), a blue pixel (60b), and a green pixel (60c). The group of unit pixels 60d-60f may be arranged in a similar manner.

As shown in the present figure, each unit pixel 60 includes a pixel electrode 110 and thin film transistor (TFT) 112 for switching the pixel electrode 110. In the depicted embodiment, the source 114 of each TFT 112 is electrically connected to a data line 100, extending from respective data line driving circuitry 120. Similarly, in the depicted embodiment, the gate 122 of each TFT 112 is electrically connected to a scanning or gate line 102, extending from respective scanning line driving circuitry driving circuitry 124. As will be further explained, the scanning line driving circuitry 124 may include a gate signal generator 220 for generating gate signals driven to the gate lines 102 to each TFT 112. In the depicted embodiment, the pixel electrode 110 is electrically connected to a drain 128 of the respective TFT 112.

In one embodiment, the data line driving circuitry 120 may send image signals (also referred to as data signals) to the pixels 60 by way of the respective data lines 100. Such image signals may be applied by line-sequence. That is, the data lines 100 (defining columns) may be sequentially activated during operation of the LCD 34. The scanning lines 102 (defining rows) may apply scanning signals from the scanning line driving circuitry 124 to the respective gates 122 of each TFT 112 to which the respective scanning lines 102 are connected. Such scanning signals may be applied by line-sequence with a predetermined timing and/or in a pulsed manner.

Each TFT 112 serves as a switching element which may be activated and deactivated (e.g., turned on and off) for a predetermined period based upon the respective presence or absence of a scanning signal at the gate 122 of the TFT 112. In embodiments, a voltage level of the scanning (gate) signal may characterize the presence or absence of the scanning signal to activate or deactivate the TFT 112. When activated, a TFT 112 may store the image signals received via a respective data line 100 as a charge in the pixel electrode 110 with a predetermined timing. The image signals stored by the pixel electrode 110 may be used to generate an electrical field between the respective pixel electrode 110 and a common electrode (not shown in FIG. 4). Such an electrical field may align liquid crystals molecules within a liquid crystal layer (not shown) to modulate light transmission through the liquid crystal layer. As will be discussed, the storage of the image signals by the pixel electrode 110 may be affected may be affected by parasitic capacitances of the TFT 112. Such parasitic capacitances may cause a voltage drop in the image signal before the image signal is stored in the pixel electrode, which may lead to light transmission inaccuracies of the pixel 60.

In some embodiments, a storage capacitor (not shown) may also be provided in parallel to the liquid crystal capacitor formed between the pixel electrode 110 and the common electrode to prevent leakage of the stored image signal by the pixel electrode 110. For example, such a storage capacitor may be provided between the drain 128 of the respective TFT 112 and a separate capacitor line.

Figure 5:
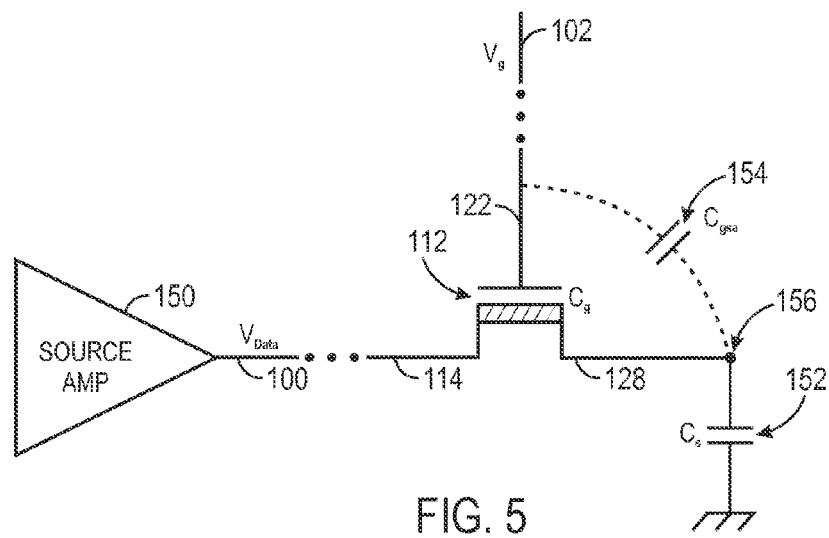
FIG. 5 is a circuit diagram showing a transistor, in accordance with aspects of the present disclosure.

FIG. 5 is a circuit diagram which depicts a transistor of an electronic component which may experience a voltage drop and/or degradation of a data signal transmitted through the transistor. While the diagram of FIG. 5 has been numbered to use the transistor 112 (i.e., the TFT 112) of FIG. 4 as an example, it should be noted that voltage drops may occur across transistors nodes of any electronic component, and the present techniques of controlling a voltage applied at the gate of the transistor may be applied to any such electronic components, and not merely to the transistor 112 of a display pixel 60.

As illustrated in FIG. 5, the transistor 112 may receive a data signal (e.g., from a data line 100, amplified by a source amplifier 150) at the source 114. The transistor 112 may have a capacitance ($C_g$) at the gate 122, and may be connected at the drain 128 to a storage capacitor ($C_s$) 152. The storage capacitor ($C_s$) 152 may typically have a small capacitance (e.g., approximately 200 cF). The transistor 112 may also have a capacitance ($C_{gs}$) 154 between the junction of the gate 122 and the drain 128. The capacitance ($C_{gs}$) 154 is not additionally configured to the transistor 112 but rather an inherent capacitance between the gate 122 and drain 128 junction which draws which draws charge from signals transmitted through the transistor 112. As such, the capacitance ($C_{gs}$) 154 may be referred to as a parasitic capacitance ($C_{gs}$) 154 and represented as being connected to the gate 122 and drain 128 of the transistor 112 by dotted lines. The parasitic capacitance ($C_{gs}$) 154 may typically have a capacitance of approximately 5-10 cF.

Figure 6:
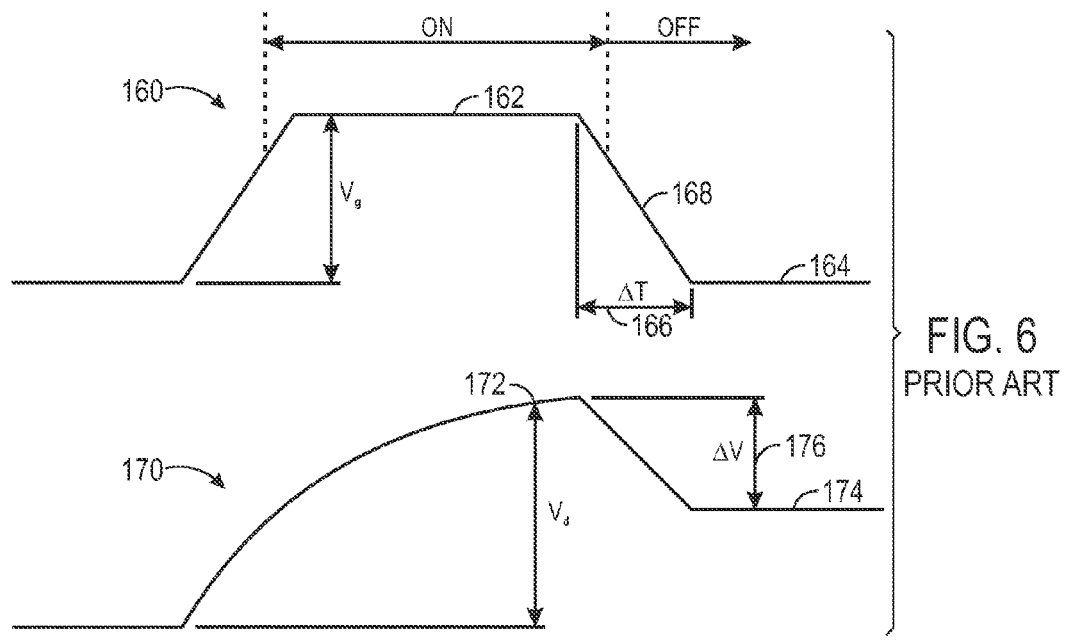
FIG. 6 illustrates an example of a gate signal applied at a transistor gate and a corresponding voltage level of a data signal at the transistor drain, in accordance with aspects of the present disclosure.

The data signal transmitted to the source 114 of the transistor 112 may be affected by parasitic capacitances ($C_{gs}$) 154 during the switching (e.g., activation and deactivation) of the transistor 112 based on a voltage applied at the transistor gate 122. More specifically, a condition referred to as "clock feedthrough" may result when charge of the data signal transmitted to the transistor 112 is lost to the parasitic capacitance ($C_{gs}$) 154, such that the data signal may experience a voltage drop at the drain 128. FIG. 6 illustrates a typical clock signal applied at the gate 122 of the transistor 112 (referred to as the gate signal 160) and a data signal transmitted to the source 114 of the transistor 112 (referred to as the data signal 170). The gate signal 160 and the data signal 170 may both be represented as voltage (having an amplitude of $V_G$ and $V_D$, respectively), with respect to time.

The switching of the transistor 112 may occur when the gate signal 160 reaches a threshold voltage level. For example, the gate signal 160 may have an activating voltage level 162 and a deactivating voltage level 164. In some embodiments, the transistor 112 may be activated at a threshold voltage level near the activating voltage level 162, as indicated by the dotted lines marking when the transistor 112 may be on (i.e., activated) or off (i.e., deactivated). As illustrated, the gate signal 160 may not be a perfect square wave, but may instead take time (e.g., change time 166) to rise or fall to the activating and deactivating voltage levels 162 and 164. The rate to fall from an activating voltage level 162 to a deactivating voltage level 164 may be referred to as the slew rate of the falling edge 168.

The data signal 170 entering the source 114 of the transistor 112 may also not automatically reach a maximum voltage value 172 when the gate signal reaches an activating voltage level 162. For example, the data signal 170 voltage level may incline relatively slowly with respect to the gate signal 160, and reach a maximum voltage level 172 after the gate signal has activated the transistor 112 for some time. However, after the gate signal deactivates the transistor 112, the data signal 170 may experience a voltage drop ($\Delta V$) 176 to a lower voltage level 174 than the maximum voltage level 172. This lower voltage level 174, also referred to as the sampled voltage level 174, may be the voltage level at which the data signal 170 is sampled (e.g., digitized, stored, output, etc.). However, sampling a data signal 170 after the voltage level has dropped significantly from the maximum voltage level 172 may result in sampling errors or incomplete data.

For example, referring again to an example using electronic displays, the voltage drop 176 at the transistor 112 drain 128 may result in a lower (i.e., degraded) voltage level 174 that is stored as data in the pixel electrode 110. The degraded data that is stored to the pixel electrode 110 may result in an inaccurate generation of the electric field between the pixel electrode 110 and the common electrode of the pixel 60 (as in FIG. 4), which may cause misalignments in the liquid crystal molecules in the liquid crystal layer and/or inaccurate modulation of light transmission through the liquid crystal layer. Such effects may manifest as artifacts and/or flickering on the displayed image.

Therefore, for some electronic components, the voltage drop ($\Delta V$) 176 may ideally be small to reduce errors in sampling (e.g., errors in saving the data signal to the pixel electrode 110) the data signal 170. When a capacitance ($C_{gs}$) 154 (FIG. 5) between the gate 122 and drain 128 of the transistor 112 is small relative to the storage capacitance ($C_s$) 152, the voltage drop ($\Delta V$) may be smaller, as represented by equation (1) below:

$$\Delta V = \frac{C_s}{C_{gs} + C_s} \cdot V_G. \qquad \text{equation (1)}$$

However, in practice, a capacitance ($C_{gs}$) 154 between the gate 122 and drain 128 may become parasitic to the transistor 112 and contribute to a substantial voltage drop ($\Delta V$) 176 between the maximum voltage 172 and the sampled voltage 174. A relationship between the voltage drop ($\Delta V$) 176, the storage capacitance ($C_s$) 152, the parasitic capacitance ($C_{gs}$) 154, the voltage at the gate 122 ($V_G$), and the voltage sampled at the drain ($V_D$), is approximated by equation (1) below:

$$\Delta V \cong \frac{C_{gs}}{C_{gs} + C_s} \cdot V_G + \frac{C_g}{2C_s} \cdot (V_G - V_D), \qquad \text{equation (2)}$$

where the first term represents clock feedthrough contribution due to parasitic capacitance ($C_{gs}$) 154. The second term of equation (2) represents the deactivation of the transistor 112 which may also contribute to clock feedthrough by decreasing the voltage level of the sampled voltage ($V_D$) 174 and increasing the voltage drop ($\Delta V$) 176. More specifically, a high slew rate of the falling edge 168, or a fast rate at which the voltage level $V_G$ of the gate signal 160 falls from an activating voltage level 162 to a deactivating voltage level 164, may contribute to the voltage drop ($\Delta V$) 176. However, in some embodiments of the present techniques, the gate signal 160 applied to switch the transistor 112 may be manipulated to decrease the slew rate 168 of the falling edge of the gate signal 160, thus minimizing the second term and limiting the voltage drop ($\Delta V$) 176 of the sampled data signal 170, as represented by equation (3):

$$\Delta V \cong \frac{C_{gs}}{C_{gs} + C_s} \cdot V_G. \qquad \text{equation (3)}$$

For example, and as will be further discussed, such techniques may involve increasing the voltage level of the gate signal 160 initially to prolong the drop from the activating voltage level 162 to a deactivating voltage level 164, thus increasing the time between the voltage levels and decreasing the slew rate 168.

In addition to clock feedthrough effects which may degrade a data signal transmitted to and sampled from a transistor in an electronic component, signals may also be susceptible to crosstalk in electronic components having one or more transistors in parallel. More specifically, crosstalk, also referred to as coupling, may occur when an electronic component includes circuitry configured such that the data signals transmitted through one circuit (e.g., a data line and/or a transistor) may affect the data signals transmitted through another circuit due to capacitive coupling between the two circuits.

Figure 7:
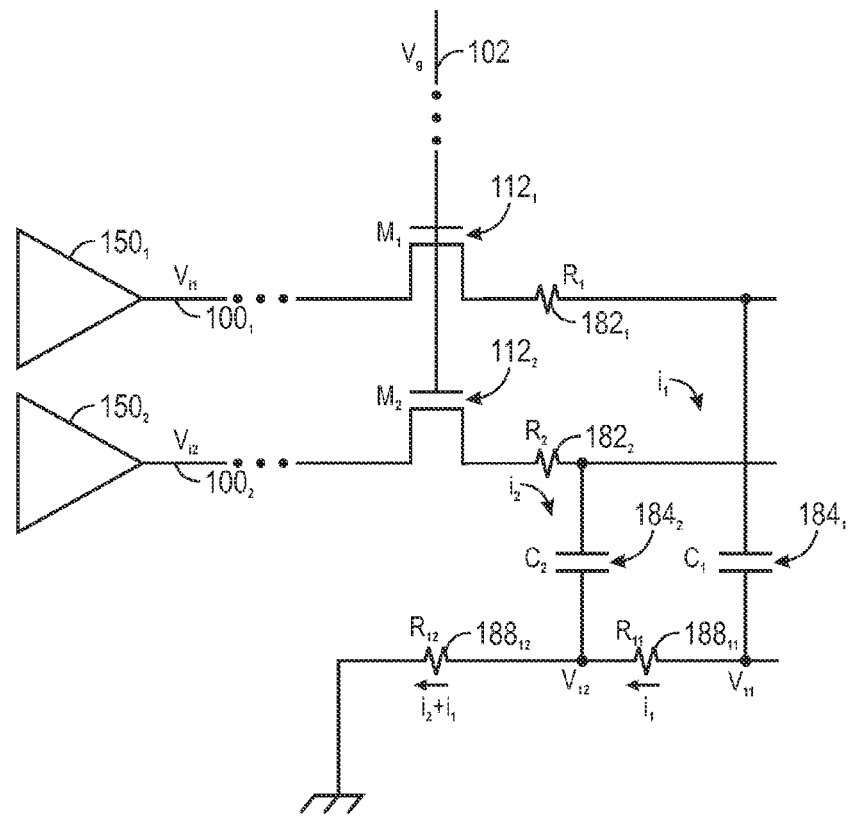
FIG. 7 is a circuit diagram showing two transistors and having parasitic capacitances, in accordance with aspects of the present disclosure.

FIG. 7 is a circuit diagram which depicts two transistors 112₁ and 112₂ connected in parallel by their respective gates via a gate line 102. As discussed, while the diagram of FIG. 7 has been numbered to use the transistor 112 (i.e., the TFT 112) of FIG. 4 as an example, it should be noted that crosstalk may occur in any electronic circuitry configured in relatively close proximity, and the present techniques of controlling a voltage applied at a transistor gate to activate such circuitry may be applied to any such electronic components, and not merely to the transistors 112 of a display pixel 60.

As illustrated in FIG. 7, each data line $100_1$ or $100_2$ having a different resistance (i.e., resistor $182_1$ or resistor $182_2$, respectively), depending on the characteristics and/or functions of the data line $100_1$ or $100_2$. Using the example of an electronic display where the transistors $112_1$ and $112_2$ are each in different pixels 60 (as in FIG. 4), the resistors $182_1$ and $182_2$ may represent the resistance of data lines $100_1$ and $100_2$ to different colored unit pixels (e.g., red, blue, or green). For example, the resistance of a data line $100_1$ to a red pixel may be approximately 10 kΩ. As discussed with respect to FIG. 4, each group of pixels 60 may include a red, blue, and green pixel, and a demultiplexer (not shown) may select a data line to a particular unit pixel 60 of a different color for periods of time in a time-multiplexed sequence based on the data line driving circuitry 120 and/or the gate line driving circuitry 124. For example, a data signal path from the data line driving circuitry 120 may demultiplex a data signal ($V_{i1}$ or $V_{i2}$) to be transmitted to a data line ($100_1$ or $100_2$) having a different resistance depending on the color of the unit pixel selected.

The signal that is sampled from the transistors $112_1$ and $112_2$ may be sampled voltages $V_1$ and $V_2$, respectively. However, due at least in part to the capacitive coupling between the two data signal paths (represented by the data lines $100_1$ and $100_2$), the signal integrity of data signals transmitted through each data line $100_1$ or $100_2$ may be affected. For example, crosstalk may occur when the data signal transmitted through one data line $100_1$ influences the signal in another data line $100_2$ due to the capacitive coupling between adjacent electrode pixels 110 (not shown in FIG. 7) in a data line $100_1$ or $100_2$. For example, such capacitive coupling may be characterized as parasitic capacitances, represented by capacitors $184_1$ and $184_2$. Parasitic capacitances may typically be approximately 20-30 pF, for example.

The resistance (e.g., $R_{11}$ $188_{11}$ and $R_{12}$ $188_{12}$) between each data line $100_1$ and $100_2$ may be ideally infinite to reduce parasitic coupling and crosstalk effects between the data line $100_1$ and $100_2$. However, in practice, the resistances $R_{11}$ $188_{11}$ and $R_{12}$ $188_{12}$ may be finite, which may enable charge distribution of the data signal through parasitic capacitances (e.g., represented by capacitors $184_1$ and $184_2$), resulting in voltages $V_{11}$ and $V_{12}$. For example, the resistances $R_{11}$ $188_{11}$ and $R_{12}$ $188_{12}$ may typically have a resistance of approximately 10 kΩ.

Figure 8:
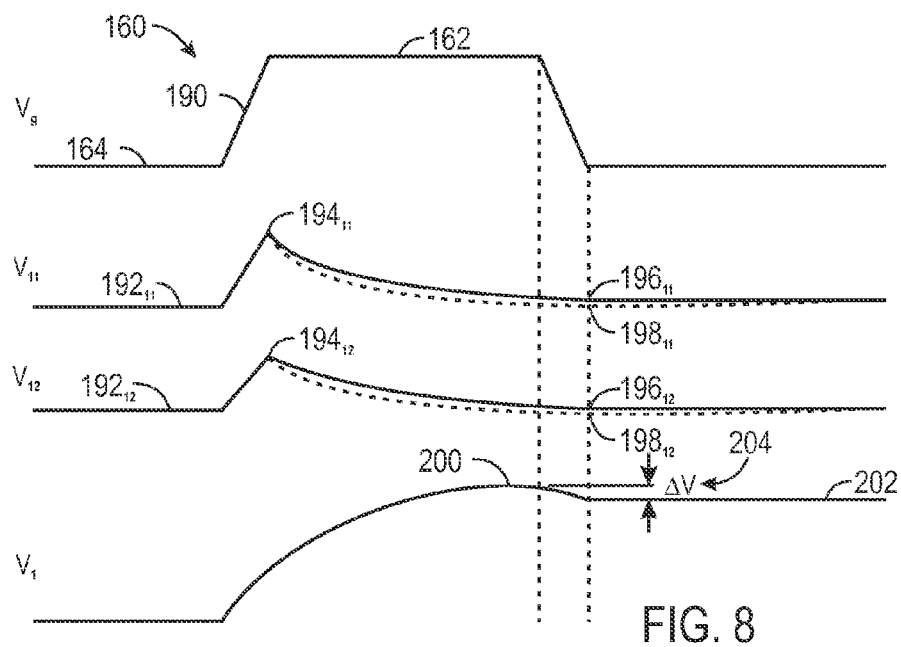
FIG. 8 illustrates an example of a gate signal applied at a transistor gate and a corresponding voltage level of a data signal at the transistor drain, in accordance with aspects of the present disclosure.

The voltages $V_{11}$ and $V_{12}$ due to the parasitic capacitances (e.g., capacitor $184_1$ and capacitor $184_2$) of each data signal path may result in a voltage drop in the voltages $V_1$ and $V_2$ sampled from the transistors $112_1$ and $112_2$ for each data signal. FIG. 8 illustrates a relationship between a voltage applied at the gate of a transistor $112_1$ or $112_2$ (referred to as the gate signal 160), a data signal at the transistor $112_1$ or $112_2$ (referred to as the data signal $V_1$), and voltages $V_{11}$ and $V_{12}$ (referred to as voltage losses). As discussed, the "sampling" of the data signal $V_1$ may refer to any output of the data signal from the transistor $112_1$ or $112_2$, including, for example, the storing of the data signal $V_1$ to a pixel electrode 110.

As shown by FIG. 8, the voltage losses $V_{11}$ and $V_{12}$ may rise from a base voltage level $192_{11}$ and $192_{12}$ to peak voltage values $194_{11}$ and $194_{12}$, respectively, with the rising edge of the gate signal 160. The voltage losses $V_{11}$ and $V_{12}$ may represent, for example, voltage loss from the data signal $V_1$. Sampling the data signal $V_1$ at a time when the voltage losses $V_{11}$ and $V_{12}$ have fallen to approximately the base voltage levels $192_{11}$ and $192_{12}$ may provide a sampled data signal $V_1$ having higher signal integrity (e.g., a lower voltage drop 204). However, at a time when the data signal $V_1$ is sampled, the voltage losses $V_{11}$ and $V_{12}$ may not have completely fallen to the base voltage levels $192_{11}$ and $192_{12}$, as indicated by the voltage levels $196_{11}$ and $196_{12}$, which may be higher than the respective base voltage levels. Sampling the data signal $V_1$ when the voltage losses $V_{11}$ and $V_{12}$ are at voltage levels $196_{11}$ and $196_{12}$ may result in sampling the data signal $V_1$ at a lower voltage level 202, which has a voltage drop 204 from the maximum voltage level 200 of the signal $V_1$.

The voltage losses $V_{11}$ and $V_{12}$ may be represented by equations (4) and (5) below:

$$V_{11} = R_{11}i_1 + V_{12} \quad \text{equation (4)}$$

$$V_{12} = R_{12}(i_2 + i_1) \quad \text{equation (5)}$$

where $i_1$ and $i_2$ represent the current through each data signal path (data line $100_1$ or $100_2$), and may be represented by equations (6) and (7) below:

$$i_1 = C_1 \frac{dVi_1}{dt} \quad \text{equation (6)}$$

$$i_2 = C_2 \frac{dVi_2}{dt}. \quad \text{equation (7)}$$

As shown by equations (4) and (5), the voltage losses $V_{11}$ and $V_{12}$ may be reduced by reducing the current ($i_1$ and $i_2$) through each data signal path (e.g., through data line $100_1$ and transistor $112_1$ and through data line $100_2$ and transistor $112_2$). Further, as represented by equations (6) and (7), the current $i_1$ and $i_2$ through each data signal path may be reduced by slowing the data signals $V_{i1}$ and $V_{i2}$ input into each of the transistors $112_1$ and $112_2$, as the current $i_1$ and $i_2$ through each signal path is directly related to the rate of change in the input signals $V_{i1}$ and $V_{i2}$. Because the voltage level of the gate voltage 160 (e.g., at the active voltage level 162) may activate the transistors $112_1$ and $112_2$ and the transmittance of the data signals through the transistors $112_1$ and $112_2$, the rate of change of the input signals $V_{i1}$ and $V_{i2}$ may be adjusted by modifying the rise of the gate signal 160 from a deactivated voltage level 164 to an activated voltage level 162. In other words, in one embodiment, and as will be further discussed, the skew rate of the rising edge 190 of the gate signal 160 may be decreased to reduce voltage losses $V_{11}$ and $V_{12}$, which may result in sampling a data signal $V_1$ having a lower voltage drop 204 and/or a higher signal integrity.

As discussed, the present embodiments include techniques for decreasing a skew rate of the falling edge 168 (FIG. 6) of a gate signal 160 to reduce clock feedthrough in a transistor 112, wherein clock feedthrough may refer to degradation (e.g., signal loss or voltage drop) of the output (e.g., sampled, stored) data signal 170 due to parasitic capacitances of the transistor 112. Furthermore, embodiments also include techniques for decreasing a skew rate of the rising edge 190 (FIG. 8) of the gate signal 160 to reduce crosstalk between the data signals $V_1$ and $V_2$ transmitted through two transistors $112_1$ and $112_2$ due to capacitive coupling between the two data signal paths. In one embodiment, the gate line driving circuitry 124 (FIG. (FIG. 4) may include circuitry such as a gate signal generator 220 for generating gate signals 160 having a decreased skew of the falling edge and/or a decreased skew of the rising edge.

Figure 9:
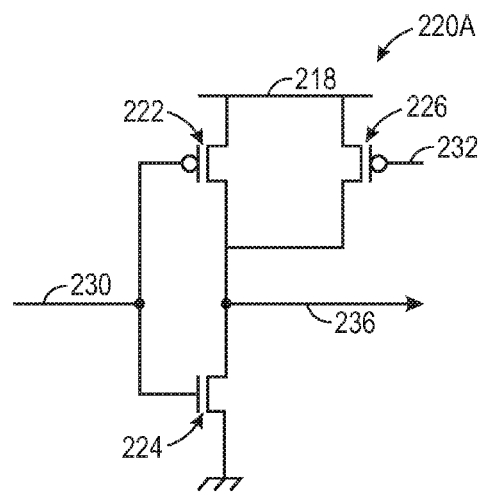
FIG. 9 is a circuit diagram showing a gate signal generator, in accordance with aspects of the present disclosure.

For example, one embodiment of a gate signal generator 220a depicted by the circuit diagram illustrated in FIG. 9 may output a gate signal having decreased skew rates at the falling edge and/or the rising edge. In one embodiment, the gate signal generator 220a may be in the gate line driving circuitry 124 and may have an output 236 to one or more gate lines 102. The gate signal generator 220a may include three transistors, with two PMOS transistors 222 and 226 and one NMOS transistor 224. One or more suitable oscillators, such as crystal oscillators, may provide signal inputs to the gate signal generator 220a. Depending on the signals applied at the input node 230 and the gate 232 of the PMOS transistor 226, the gate signal output from the output node 236 may be manipulated to form gate signals having decreased skew rates at the falling edge and/or the rising edge.

Figure 10:
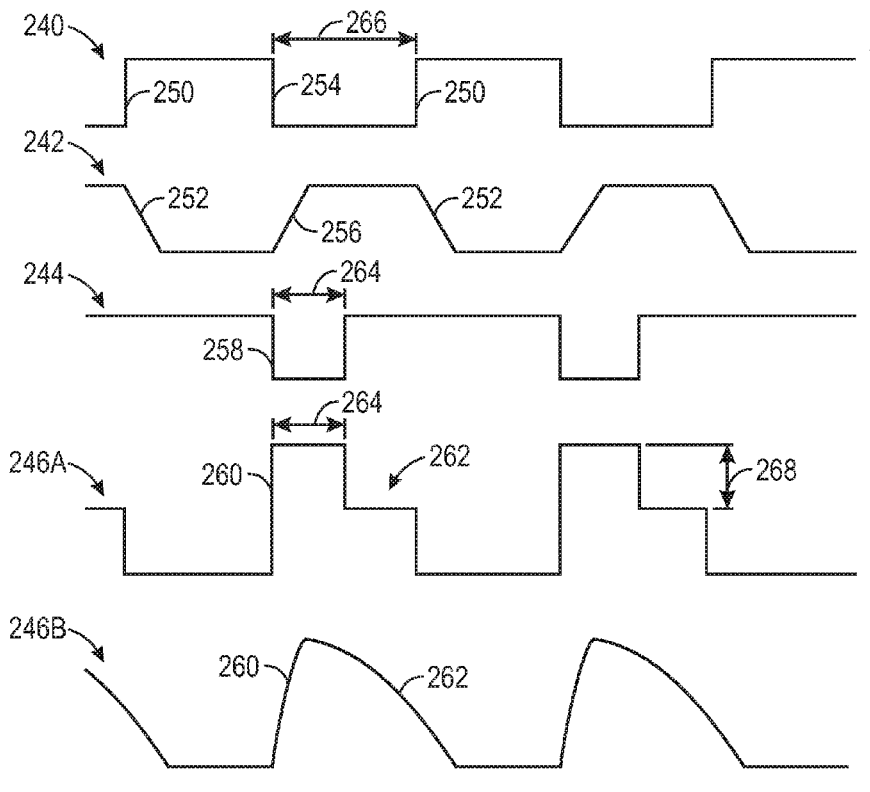
FIG. 10 is a set of diagrams depicting a gate signal having a slow falling falling edge which may be produced using the circuit diagram presented in FIG. 9, in accordance with aspects of the present disclosure.

A set of diagrams depicting a gate signal having a falling edge with a decreased skew rate (generated by using the gate signal generator 220a of FIG. 9) is provided in FIG. 10. Beginning first with an explanation of outputting a neutral gate signal 242 (e.g., without decreases to the falling edge skew rate or rising edge skew rate) from the gate signal generator 220a, the PMOS transistor 226 may be deactivated by driving a high voltage to the gate 232 of the PMOS transistor 226. With the PMOS transistor 226 deactivated and in a high resistance state, the voltage level of the signal 240 applied at the input node 230 will either activate or deactivate the PMOS transistor 222 and NMOS transistor 224. A high voltage level at the input node 230 may result in a high resistance state in the PMOS transistor 222 and a low resistance state in NMOS state in NMOS transistor 224. As the voltage may be blocked by the PMOS transistor 222 and passed by the NMOS transistor 224, the voltage may be drawn to the ground, such that the output response to a high voltage signal applied at the input node 230 may be a low voltage output from the output node 236. This may be indicated by the rising edge 250 of the clock signal 240 and the corresponding falling edge 252 of the output neutral gate signal 242.

A low voltage level at the input node 230 may result in a low resistance state in the PMOS transistor 222 and a high resistance state in the NMOS transistor 224. As voltage may be blocked by the NMOS transistor 224 and passed by the PMOS transistor 222, the voltage may flow from the supply line 218 to the output node 236, such that the output response to a low voltage signal may be a high voltage output from the node 236. This relationship may be further illustrated by the falling edge 254 (of the low voltage level) of the input signal 240 (to the input node 230) and the corresponding rising edge 256 of the neutral gate signal 242 generated by the gate signal generator 220a.

In one embodiment, a gate signal having a falling edge with a decreased skew rate may be generated by pre-emphasizing the rising edge of a signal (i.e., generating a pre-emphasized gate signal). Pre-emphasizing the rising edge 260 may refer to initially increasing the voltage level of the pre-emphasized gate signal 246 during an activation period. By pre-emphasizing the rising edge 260, the higher voltage level of the gate signal 246 may take a longer time to fall, resulting in a decreased falling edge 262 skew rate. To pre-emphasize the rising edge 260, additional voltage may be drawn from the supply line 218 to initially increase the voltage level of the pre-emphasized gate signal 246. A pre-emphasized gate signal may be theoretically may be theoretically represented by signal 246A, which may more clearly show the pre-emphasis generated by the initial voltage increase. A pre-emphasized gate signal is also provided in the form of signal 246B, which approximates a pre-emphasized gate signal waveform in practice, as gate signals may not always have a square waveform and/or straight edges. The rising edge 260 and falling edge 262 have been numbered similarly for both representations of the pre-emphasized gate signal 246A and 246B, and the following explanations will simply make reference to the pre-emphasized gate signal 246.

To initially increase the voltage level of the pre-emphasized gate signal 246, the activation of the PMOS transistor 226 may be synchronized with an activation of the PMOS transistor 222, as indicated by the falling edges of the input signals 240 and 244 into the node 230 and the gate 232 of the PMOS transistor 226, respectively. The activation of the PMOS transistor 226 may be for a shorter time duration (time period 264) than the activation of the PMOS transistor 222 (time period 266). The shorter activation of the PMOS transistor 226 may contribute to an increased voltage 268 during the initial portion (time period 264) of a logic high of the pre-emphasized gate signal 246. The PMOS transistor 226 may be activated by driving a low input voltage (indicated by the falling edge 258) in the signal 244 applied at the gate 232 of the PMOS transistor 226. The resulting voltage may produce a pre-emphasized gate signal 246 having a decreased falling edge 262 skew rate. For example, the falling edge 262 of the pre-emphasized gate signal 246 may have a skew rate that is lower than the falling edge 252 of the neutral gate signal 242.

Figure 11:
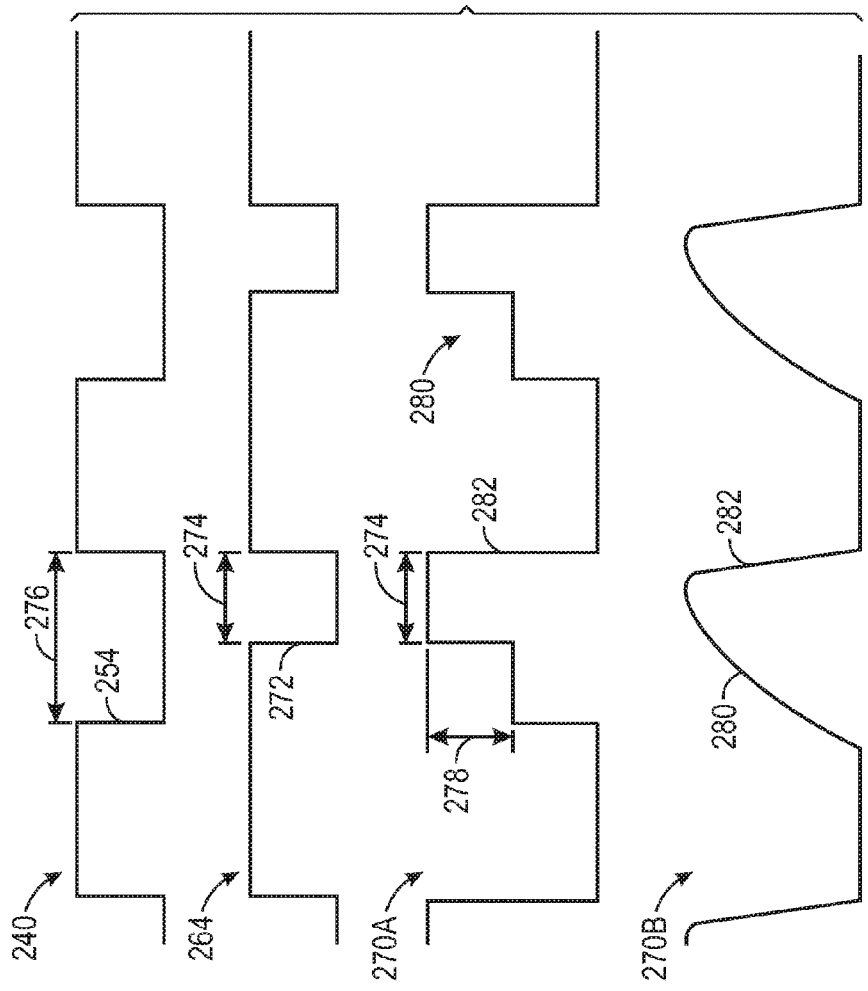
FIG. 11 is a set of diagrams depicting another gate signal having a slow rising edge which may be produced using the circuit diagram presented in FIG. 9, in accordance with aspects of the present disclosure.

Similarly, as depicted by the set of diagrams illustrated in FIG. 11, a gate signal having a rising edge 280 with a decreased skew rate may be generated by emphasizing the falling edge 282 of the gate signal. Emphasizing the falling edge 282, also referred to as post-emphasizing the gate signal 270, may refer to increasing the voltage level of the gate signal near the end of an activation period of the gate signal. By emphasizing the falling edge 282, the higher voltage level of the post-emphasized gate signal 270 may take a longer time to rise, resulting in a decreased rising edge 280 skew rate. A post-emphasized gate signal may be theoretically represented by signal 270A, which may more clearly show the post-emphasis generated by the voltage increase near the end of the activation period of the signal. A post-emphasized gate signal is also provided in the form of signal 270B, which approximates a post-emphasized gate signal waveform in practice, as gate signals may not always have a square waveform and/or straight edges. The rising edge 280 and falling edge 282 have been numbered similarly for both representations of the pre-emphasized gate signal 270A and 270B, and the following explanations will simply make reference to the pre-emphasized gate signal 270.

To emphasize the falling edge 270, the activation of the PMOS transistor 226 may be synchronized occur at an end of an activation period of the PMOS transistor 222, as indicated by the falling edge 254 of the input signal 240 (into the node 230) and the subsequent falling edge 272 of the input signal 264 (the gate 232 of the PMOS transistor 226). The activation of the PMOS transistor 226 may be for a shorter time duration (time period 274) than the activation of the PMOS transistor 222 (time period 276). The shorter activation of the PMOS transistor 226 may contribute to an increased voltage 278 to the later portion of a logic high of the post-emphasized gate signal 270. The PMOS transistor 226 may be activated by driving a low input voltage (indicated by the falling edge 272) in the signal 264 applied at the gate 232 of the applied at the gate 232 of the PMOS transistor 226. The resulting voltage may produce a post-emphasized gate signal 270 having a decreased rising edge 280 skew rate. For example, the rising edge 280 of the post-emphasized gate signal 270 may have a skew rate that is lower than the rising edge 256 of the neutral gate signal 242 (FIG. 10).

It should be noted that in embodiments, gate signals may vary in shape. For example, gate signals may have a square waveform, a trapezoidal waveform, or may not have straight rising or falling edges. Gate signal waveforms may be curved or sinusoidal, and may be affected by noise and/or degradation, for example. Further, different frequencies of input signals may be used to generate and output different gate signals. The gate signal generator may output different gate signals, having different skew rates at the rising or falling edges depending on the frequencies of the input signals, the amplitudes of the input signals, and/or the configuration of the gate signal generator 220a. For example, the input signal 240 may be input into the node 230 of the gate signal generator 220a, and the input signal 282 may be input into the gate 232 of the PMOS transistor 226 (FIG. 9).

Figure 12:
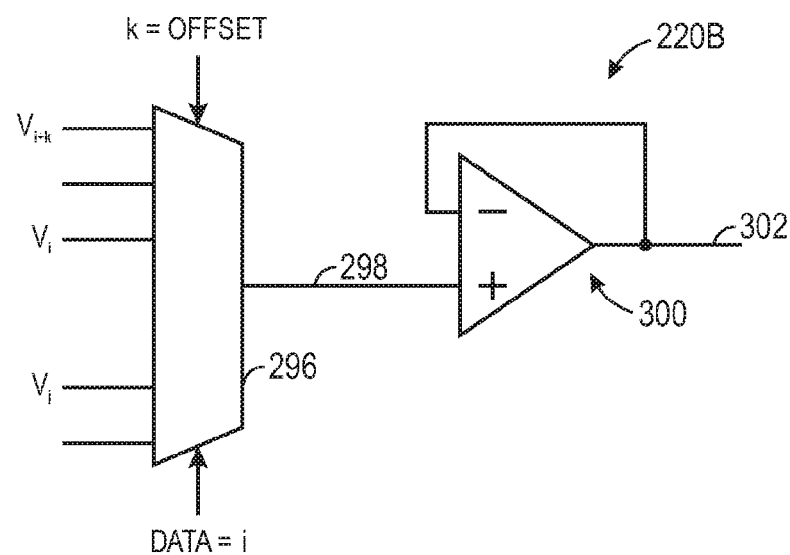
FIG. 12 is a circuit diagram depicting an analog equivalent for the gate signal generator illustrated in FIG. 9, in accordance with aspects of the present disclosure.
Figure 13:
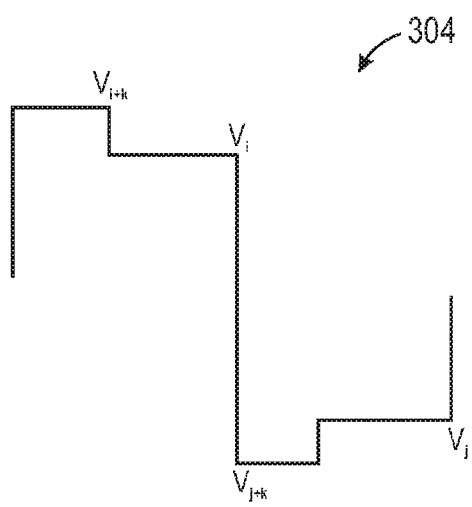
FIG. 13 is a diagram depicting a signal produced in response to different inputs of the circuit illustrated in FIG. 12, in accordance with aspects of the present disclosure.

Furthermore, gate signals produced in accordance with the present techniques of decreasing a rising and/or falling edge skew rate to reduce clock feedthrough and/or crosstalk may also be generated using different circuitry. For example, in addition to the gate signal generator 220A, the circuit diagram illustrated in FIG. 12 depicts another gate signal generator 220B which may generate gate signals having a decreased rising and/or falling edge skew rate. FIG. 12 may be an analog equivalent circuit 220B to the gate signal generator 220A discussed in FIG. 9. A signal 302 produced by the analog clock generator 220B is illustrated in FIG. 13. The analog analog clock generator 220B may include a multiplexer 296 configured to select various voltage levels. The multiplexer output 298 may be input into an amplifier 300, which may produce a gate signal output 302, such as the signal 304. The input $V_{i+k}$ of the multiplexer 296 may produce an output 302 of an emphasized portion of the signal 298 (FIG. 12), the input $V_i$ may produce an output 302 having the voltage level of a logic high of the output gate signal 302, and the input $V_j$ may be the voltage of a logic low of the output gate signal 302. For example, in some embodiments, the input $V_{i+k}$ may be used at an initial portion of a gate signal and/or a later portion of the gate signal to generate a pre-emphasized and/or a post-emphasized gate signal. In some embodiments, the pre-emphasized gate signal may have a decreased falling edge skew rate which may reduce clock feedthrough in a transistor of an electronic component, and the post-emphasized gate signal may have a decreased rising edge skew rate which may reduce crosstalk in transistors and/or data lines in an electronic component.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic system, comprising:
    gate line driving circuitry configured to:
        generate a gate clock signal;
        generate and transmit a first gate signal to a gate of a first transistor to reduce a voltage drop of a first data signal transmitted to the first transistor, wherein generating the first gate signal comprises increasing a voltage amplitude of the first gate signal during an initial portion of an activation period of the first gate signal relative to a later portion of the activation period, and wherein the voltage amplitude of the first gate signal is increased during a single clock pulse of the gate clock signal; and
        generate and transmit a second gate signal to a gate of a second transistor to reduce a voltage drop of a second data signal transmitted to the second transistor;
    wherein the gate line driving circuitry comprises a gate signal generator, comprising:
        a first p-channel metal oxide semiconductor (PMOS) transistor configured to receive the gate clock signal, wherein the first PMOS transistor is configured to activate during the single clock pulse of the gate clock signal, and wherein the first PMOS transistor is configured to increase the voltage amplitude during the later portion of the activation period of the gate signal;
        an n-channel metal oxide semiconductor (NMOS) transistor coupled to the first PMOS transistor and configured to receive the gate clock signal, wherein the NMOS transistor is configured to activate during an activation period of the gate clock signal; and
        a second PMOS transistor coupled to the first PMOS transistor and the NMOS transistor, wherein the second PMOS transistor is configured to activate and increase the voltage amplitude during the initial portion of the activation period of the gate signal.

2. The electronic system of claim 1, wherein the gate line driving circuitry is configured to generate the second gate signal to increase a voltage amplitude of the second gate signal during a later portion of an activation period of the second gate signal relative to an initial portion of the activation period of the second gate signal.

3. The electronic system of claim 1, wherein the first gate signal comprises an activation period having a first voltage level and a second voltage level, wherein the first voltage level precedes the second voltage level during the activation period, and wherein the first voltage level is higher than the second voltage level.

4. The electronic system of claim 3, wherein the second gate signal comprises a post-emphasized activation period having an first voltage level and a second voltage level, wherein the first voltage level precedes the second voltage level during the activation period, and wherein the first voltage level is lower than the second voltage level.

5. The electronic system of claim 4, wherein the gate line driving circuitry is configured to generate the second gate signal to reduce a coupling effect between the first data signal and the second data signal as compared to a coupling effect when a gate signal not comprising the post-emphasized activation period is driven to the second transistor.

6. A display system comprising:
    a matrix of pixels, each of the pixels comprising a transistor;
    gate line driving circuitry configured to transmit a gate signal to a gate of the transistor of each of the pixels, wherein the gate line driving circuitry comprises:
        a gate signal generator configured to:
            receive a pulsed clock signal comprising a plurality of clock pulses;
            generate the gate signal to correspond at least in part to the pulsed clock signal; and
            increase a voltage amplitude of the gate signal during at least one of an initial portion of a logically high period of the gate signal and a later portion of the logically high period of the gate signal, wherein increasing the voltage amplitude comprises increasing the voltage amplitude during each single clock pulse of the plurality of clock pulses of the pulsed clock signal; and data line driving circuitry configured to transmit a data signal to a source of the transistor of each of the pixels, wherein increasing the voltage amplitude during the at least one of the initial portion of the logically high period and the later portion of the logically high period comprises reducing a voltage drop of the data signal across the transistor;

wherein the gate signal generator comprises:

a first transistor comprising a first polarity channel and configured to receive the pulsed clock signal, wherein the first transistor is configured to activate during each single clock pulse of the plurality of clock pulses, and wherein the first transistor is configured to increase the voltage amplitude during the later portion of the logically high period of the gate signal;

a second transistor comprising a second polarity channel and configured to receive the pulsed clock signal, wherein the second transistor is configured to activate during a plurality of activation periods of the pulsed clock signal; and a third transistor comprising a polarity channel corresponding to the first polarity channel and configured to receive a second pulsed signal, wherein the third transistor is configured to activate during clock pulses of the second pulsed signal, and wherein the third transistor is configured to increase the voltage amplitude during the initial portion of the logically high period of the gate signal.

7. The display system of claim 6, wherein the gate signal generator is configured to increase the voltage amplitude during the initial portion of the logically high period to control a clock feedthrough effect of the transistor.

8. The display system of claim 6, wherein the gate signal generator is configured to increase the voltage amplitude during the later portion of the logically high period to control a crosstalk effect of the transistor.

9. The display system of claim 6, wherein the gate signal generator is configured to select one or more voltages to generate the gate signal, wherein the one or more voltages comprises:

a first voltage;
a second voltage less than the first voltage; and
a third voltage less than the second voltage.

10. The display system of claim 9, wherein the gate signal generator is configured to output a pre-emphasized signal to reduce the voltage drop of the data signal across the transistor, wherein the pre-emphasized signal comprises the first voltage followed by the second voltage followed by the third voltage.

11. The display system of claim 9, wherein the gate signal generator is configured to output a post-emphasized signal to reduce the voltage drop of the data signal across the transistor, wherein the post-emphasized signal comprises the second voltage followed by the first voltage followed by the third voltage.

12. A display system comprising:

a matrix of pixels, each of the pixels comprising a transistor;

gate line driving circuitry configured to transmit a gate signal to a gate of the transistor of each of the pixels, wherein the gate line driving circuitry comprises:

a gate signal generator configured to:
receive a pulsed clock signal comprising a plurality of clock pulses;
generate the gate signal to correspond at least in part to the pulsed clock signal; and
increase a voltage amplitude of the gate signal during at least one of an initial portion of a logically high period of the gate signal and a later portion of the logically high period of the gate signal, wherein increasing the voltage amplitude comprises increasing the voltage amplitude during each single clock pulse of the plurality of clock pulses of the pulsed clock signal; and data line driving circuitry configured to transmit a data signal to a source of the transistor of each of the pixels, wherein increasing the voltage amplitude during the at least one of the initial portion of the logically high period and the later portion of the logically high period comprises reducing a voltage drop of the data signal across the transistor;

wherein the gate signal generator comprises:

a voltage selection device configured to select at least one of a plurality of received voltage levels, wherein the plurality of received voltage levels comprises a first voltage level corresponding to the voltage amplitude increase of the gate signal during the initial portion of the logically high period of the gate signal and a second voltage level corresponding to the voltage amplitude increase of the gate signal during the later portion of the logically high period of the gate signal; and an amplifier coupled to the voltage selection device, wherein the amplifier is configured to output the gate signal comprising at least the first voltage level and the second voltage level.

\* \* \* \* \*